United States Patent
Yu et al.

(10) Patent No.: US 8,592,997 B2
(45) Date of Patent: Nov. 26, 2013

(54) MOLDED UNDERFILL FLIP CHIP PACKAGE PREVENTING WARPAGE AND VOID

(75) Inventors: Hae-jung Yu, Anyang-si (KR);
Hyeong-seob Kim, Cheonan-si (KR);
Jong-ho Lee, Hwaseong-si (KR);
Jin-woo Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 293 days.

(21) Appl. No.: 12/916,677

(22) Filed: Nov. 1, 2010

(65) Prior Publication Data

US 2011/0193228 A1 Aug. 11, 2011

(30) Foreign Application Priority Data

Feb. 8, 2010 (KR) .................. 10-2010-0011473

(51) Int. Cl.
*H01L 23/28* (2006.01)
(52) U.S. Cl.
USPC .................................. 257/787; 257/E23.116
(58) Field of Classification Search
USPC ........................................ 257/787, E23.116
See application file for complete search history.

(56) References Cited

U.S. PATENT DOCUMENTS

| 2007/0224729 A1 | 9/2007 | Reiss et al. | |
| 2008/0054494 A1* | 3/2008 | Chen et al. | 257/787 |
| 2008/0099890 A1* | 5/2008 | Chen et al. | 257/666 |
| 2010/0044880 A1* | 2/2010 | Aokura et al. | 257/777 |

FOREIGN PATENT DOCUMENTS

| JP | 2003-017625 A | 1/2003 |
| JP | 2008-177345 A | 7/2008 |

* cited by examiner

*Primary Examiner* — Phat X Cao
(74) *Attorney, Agent, or Firm* — Harness, Dickey & Pierce, P.L.C.

(57) ABSTRACT

A molded underfill flip chip package may include a printed circuit board, a semiconductor chip mounted on the printed circuit board, and a sealant. The printed circuit board has at least one resin passage hole passing through the printed circuit board and at least one resin channel on a bottom surface of the printed circuit board, the at least one resin channel extending from the at least one resin passage hole passing through the printed circuit board. The sealant seals a top surface of the printed circuit board, the semiconductor chip, the at least one resin passage hole, and the at least one resin channel.

20 Claims, 7 Drawing Sheets

MOLDED UNDERFILL FLIP CHIP PACKAGE PREVENTING WARPAGE AND VOID

CROSS-REFERENCE TO RELATED APPLICATIONS

This application claims priority under 35 U.S.C. §119 to Korean Patent Application No. 10-2010-0011473, filed on Feb. 8, 2010, in the Korean Intellectual Property Office (KIPO), the entire contents of which is incorporated herein by reference.

BACKGROUND

1. Field

Example embodiments relate to a semiconductor package in which a semiconductor chip is mounted on a printed circuit board, and more particularly, to a molded underfill flip chip package in which a semiconductor chip is mounted on a printed circuit board through bumps.

2. Background

Semiconductor device manufacturers make great efforts to reduce the sizes and thicknesses of semiconductor packages because smaller and thinner semiconductor packages reduce the sizes of electronic devices in which the semiconductor packages are mounted. Further, a decrease in the sizes and thicknesses of semiconductor packages may reduce semiconductor package manufacturing costs. Accordingly, global semiconductor device manufacturers are competitively shipping semiconductor packages in a compact and advanced faun, such as a flip chip package, chip scale package (CSP) and wafer level package (WLP).

While semiconductor packages in an advanced form achieve miniaturization and high integration, the semiconductor packages require high reliability when actually used. In addition, it is required to reduce an error rate in a semiconductor package manufacturing process to improve production efficiency. Moreover, low manufacturing cost is needed to increase competitiveness.

SUMMARY

Example embodiments provide a molded underfill flip chip package for improving a structure of a semiconductor package to prevent or reduce warpage and voids in the semiconductor package so as to increase reliability of the semiconductor package.

In accordance with an example embodiment, a molded underfill flip chip package may include a printed circuit board, a semiconductor chip mounted on the printed circuit board, and a sealant. The printed circuit board has at least one resin passage hole passing through the printed circuit board and at least one resin channel on a bottom surface of the printed circuit board, the at least one resin channel extending from the at least one resin passage hole passing through the printed circuit board. The sealant seals a top surface of the printed circuit board, the semiconductor chip, the at least one resin passage hole, and the at least one resin channel.

In accordance with an example embodiment, a molded underfill flip chip package may include a printed circuit board including at least one resin channel extending on a bottom surface of the printed circuit board, a semiconductor chip mounted on the printed circuit board through bumps, and a sealant sealing a top surface the printed circuit board, the semiconductor chip, and the at least one resin channel.

In accordance with an example embodiment, a molded underfill flip chip package may include a printed circuit board, a semiconductor chip mounted on the top surface of the printed circuit board, and at least one resin plug. The printed circuit board has at least one resin passage hole passing through the printed circuit board. The printed circuit board further includes at least one resin channel on a bottom surface of the printed circuit board. In this example embodiment, the at least one resin channel extends from the at least one resin passage hole. The at least one resin plug locks the printed circuit board to the semiconductor chip. In this example embodiment, the at least one resin plug passes through the at least one resin passage hole and fills at least a portion of the at least one resin channel.

According to an example embodiment, there is provided a molded underfill flip chip package including a printed circuit board having at least one resin passage hole, a semiconductor chip mounted on the printed circuit board, a sealant sealing up the surface of the printed circuit board and the semiconductor chip, and a resin channel extended to the backside of the printed circuit board through the resin passage hole formed in the printed circuit board.

The resin passage hole may be formed in a region of the printed circuit board other than an exposed printed circuit pattern of the printed circuit board. The semiconductor chip may be mounted on the printed circuit board through bumps. The semiconductor chip may be back-ground.

The sealant may fill a space between neighboring bumps formed between the semiconductor chip and the printed circuit board. The printed circuit board may be of a flexible type or a rigid type.

The resin channel may include a single row, a plurality of parallel rows, or a plurality of rows and columns arranged in a matrix form.

The molded underfill flip chip package may further include a solder ball bonded to the backside of the printed circuit board. The resin channel may have a height equal to or lower than half the height of the solder ball.

The resin passage hole may be overlapped on the resin channel in the printed circuit board. The resin passage hole may not be overlapped on the resin channel in the printed circuit board. The resin passage hole may be formed in a region of the printed circuit board, on which the semiconductor chip is mounted. The resin passage hole may be formed in a region of the printed circuit board, on which the semiconductor chip is not mounted.

The molded underfill flip chip package may further include an extra resin repository formed at the end of the resin channel.

According to an example embodiment, there is provided a molded underfill flip chip package including a printed circuit board used to manufacture a semiconductor package, a semiconductor chip mounted on the printed circuit board through bumps, a sealant sealing up the surface of the printed circuit board and the semiconductor chip, and a resin channel extended to the backside of the printed circuit board.

The resin channel may include a plurality of parallel rows on the backside of the printed circuit board.

The resin channel may include an extra resin repository formed at the end thereof.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail by referring to the drawings.

Figure 1:
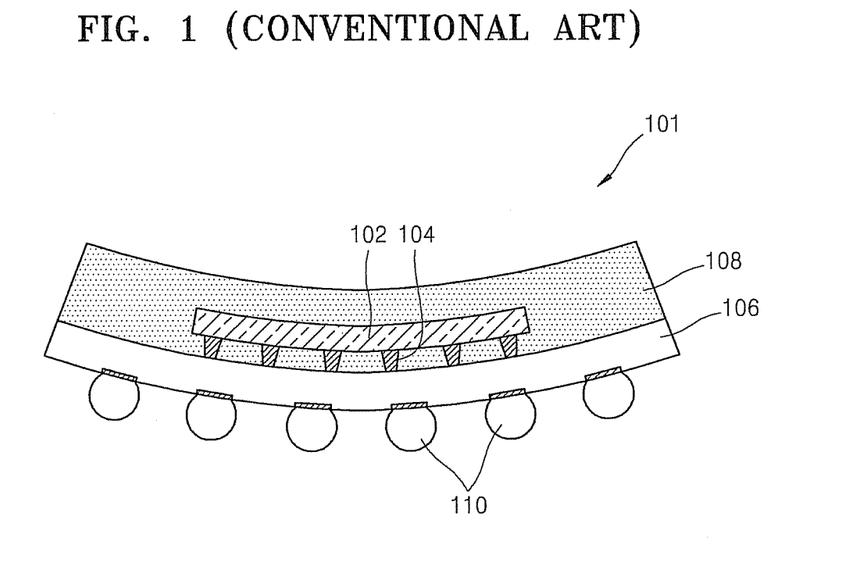
FIG. 1 is a cross-sectional view showing warpage that may occur in a semiconductor package.

FIG. 1 is a cross-sectional view showing warpage that may occur in a molded underfill flip chip package 101.

Referring to FIG. 1, a semiconductor chip 102 is background, and then the semiconductor chip 102 is mounted on a printed circuit board 106 through bumps 104 functioning as a connecting structure. Accordingly, the semiconductor chip 102 and the printed circuit board 106 are electrically connected to each other through the bumps 104. Then, the surface of the printed circuit board 106 and the semiconductor chip 102 are sealed using a sealant 108, for example, epoxy mold compound (EMC). Here, the sealant 108 fills spaces between neighboring bumps 104 formed between the printed circuit board 106 and the semiconductor chip 102. Solder balls 110 functioning as another conductive connecting structure are bonded to backside of the printed circuit board 106 to accomplish the molded underfill flip chip package 101 having a reduced thickness.

In the molded underfill flip chip package 101 having the aforementioned structure, spaces between neighboring bumps 104 formed between the semiconductor chip 102 and the printed circuit board 106 are filled with the sealant 108 instead of an additional underfill material to simplify the manufacturing process and reduce the manufacturing cost. However, since the surface of the printed circuit board 106 is sealed up with the sealant 108, the molded underfill flip chip package 101 is vulnerable to a warpage defect, and thus the molded underfill flip chip package 101 may be warped as shown in FIG. 1.

The warpage defect may deteriorate coplanarity of the solder balls 110 when the molded underfill flip chip package 101 is mounted in an electronic device and this may cause poor mounting.

Figure 2:
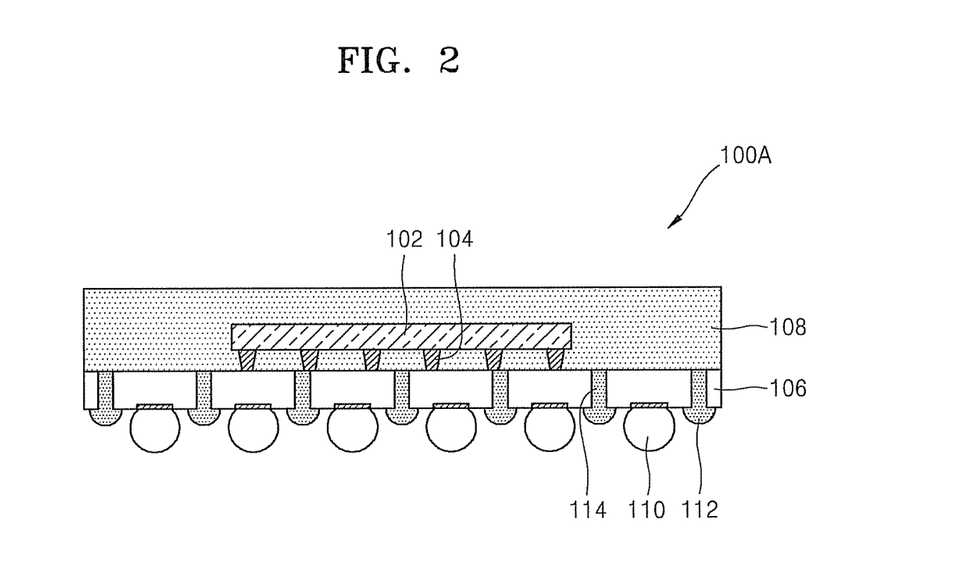
FIG. 2 is a cross-sectional view of a molded underfill flip chip package according to an example embodiment of the invention.

FIG. 2 is a cross-sectional view for explaining a molded underfill flip chip package 100A that may prevent or reduce warpage and voids according to an example embodiment of the invention.

Referring to FIG. 2, the molded underfill flip chip package 100A includes a printed circuit board 106 having at least one resin passage hole 114. The printed circuit board 106 includes an insulating layer and a conductive printed circuit pattern (not shown), in general. The resin passage hole 114 penetrates a region of the insulating layer, on which the printed circuit pattern is not formed. Further, the printed circuit board 106 may be a flexible type printed circuit board using polyimide or a rigid type printed circuit board using FR4 or BT resin.

In addition, the molded underfill flip chip package 100A includes a semiconductor chip 102 mounted on the printed circuit board 106 through bumps 104 functioning as connecting structure. The semiconductor chip 102 may be background and may have a thickness in the range of 30 to 100 μm, and thus the semiconductor chip 102 may be vulnerable to a warpage defect.

While the semiconductor chip 102 is mounted on the printed circuit board 106 through the bumps 104 in the current example embodiment, the semiconductor chip 102 may be mounted through other methods such as wire bonding or through silicon via (TSV). In addition, the semiconductor chip 102 may be mounted on the printed circuit board 106 using other structures, for example, studs.

The molded underfill flip chip package 100A includes a sealant 108 that seals up the surface of the printed circuit board 106 and the semiconductor chip 102. The sealant may be EMC. In this example embodiment, the sealant fills spaces between neighboring bumps 104 arranged between the semiconductor chip 102 and the printed circuit board 106. Accordingly, an additional underfill material for filling the space between the semiconductor chip 102 and the printed circuit board 106 is not needed.

The molded underfill flip chip package 100A according to the current example embodiment includes a resin channel 112 extending to the backside (bottom surface) of the printed circuit board 106 through the resin passage hole 114 farmed in the printed circuit board 106. Here, the resin passage hole 114 may be formed in a region of the printed circuit board 106, on which the semiconductor chip 102 is mounted or a region of the printed circuit board 106, on which the semiconductor chip 102 is not mounted. That is, the resin passage hole 114 may be formed in various positions in the printed circuit board 106 irrespective of the position of the semiconductor chip 102.

The molded underfill flip chip package 100A according to the current example embodiment includes solder balls 110 bonded to the backside (bottom surface) of the printed circuit board 106. The solder balls are not limited to a ball shape and may be formed in other shapes, for example, a land shape.

In the molded underfill flip chip package 100A according to the current example embodiment, the sealant 108 locks the printed circuit board 106 from a top surface of the printed circuit board 106 to the backside (bottom surface) of the printed circuit board 106 through the resin passage hole 114 and the resin channel 112. Accordingly, a warpage defect generated in the flip chip package 100A can be prevented or reduced, and thus it is possible to prevent poor mounting that may be caused by the warpage defect during a process of mounting the molded underfill flip chip semiconductor package 100A in an electronic device after the molded underfill flip chip semiconductor package 100A is manufactured.

Furthermore, the sealant 108 having a hygroscopic property (e.g. moisture absorption rate) lower than that of the printed circuit board 106 penetrates the printed circuit board 106 and is formed on the backside of the printed circuit board 106 in the form of the resin channel 112, and thus absorption reliability of the molded underfill flip chip package 100A can be improved.

Figure 3:
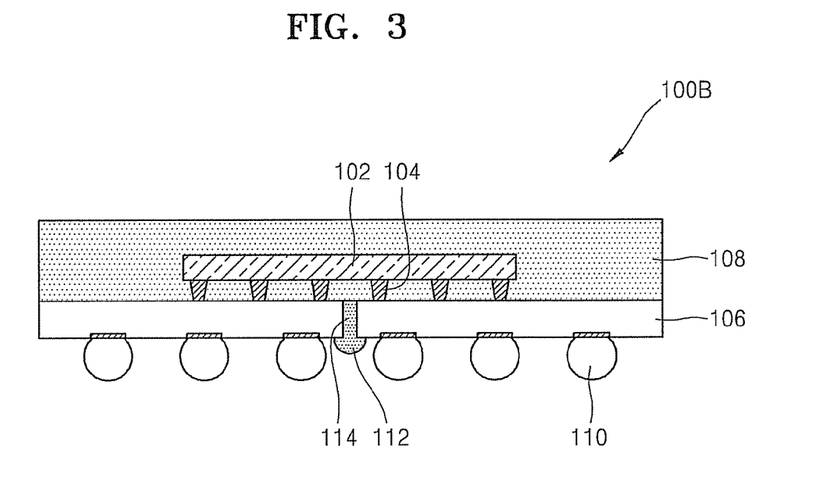
FIG. 3 is a cross-sectional view of a molded underfill flip chip package according to another example embodiment of the invention.

FIG. 3 is a cross-sectional of a molded underfill flip chip package 100B that may prevent or reduce warpage and voids according to another example embodiment of the invention.

Referring to FIG. 3, the molded underfill flip chip package 100B includes the printed circuit board 106 having at least one resin passage hole 114, the semiconductor chip 102 mounted on the printed circuit board 106, the sealant 108 sealing up the surface of the printed circuit board 106 and the semiconductor chip 102, and the resin channel 112 extending to the backside of the printed circuit board 106 through the resin passage hole 114 formed in the printed circuit board 106. While the molded underfill flip chip package 100A shown in FIG. 2 has a plurality of resin passage holes 114 and resin channels 112, the molded underfill flip chip package 100B shown in FIG. 3 has one resin passage hole 114 and one resin channel 112. Even if only one resin channel 112 is formed on an axis at which a warpage defect is generated, a warpage defect prevention effect can be improved.

Figure 4:
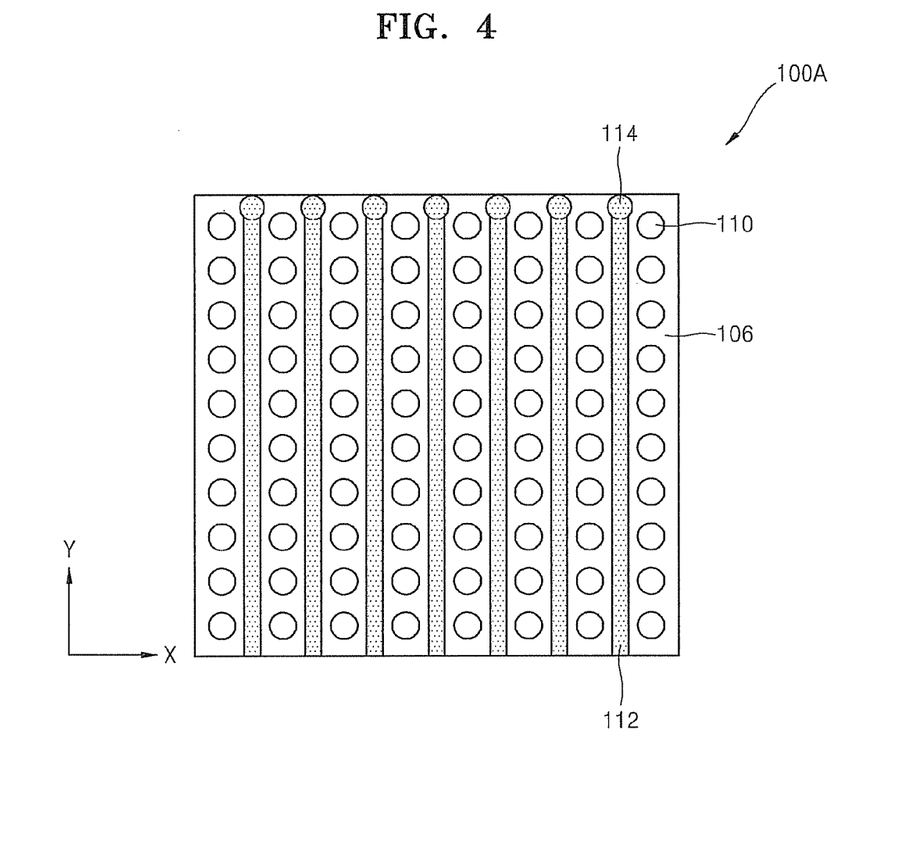
FIG. 4 is a bottom view of a molded underfill flip chip package having the cross-section shown in FIG. 2 according to an example embodiment of the invention.
Figure 5:
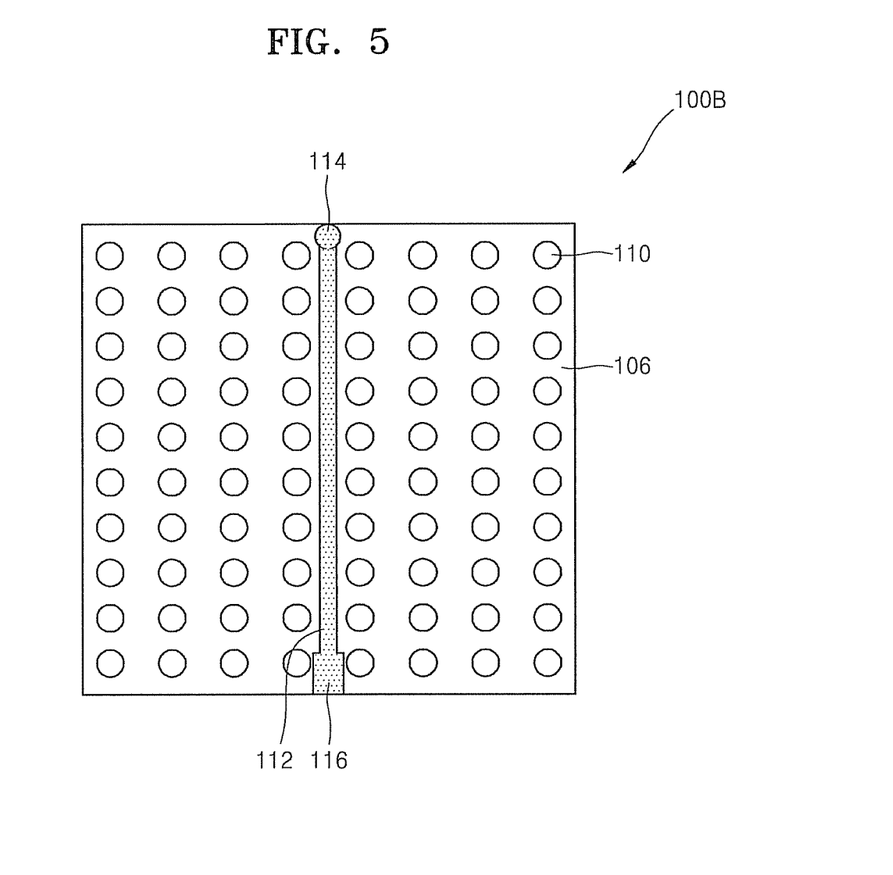
FIG. 5 is a bottom view of a molded underfill flip chip package having the cross-section shown in FIG. 3 according to an example embodiment of the invention.
Figure 6:
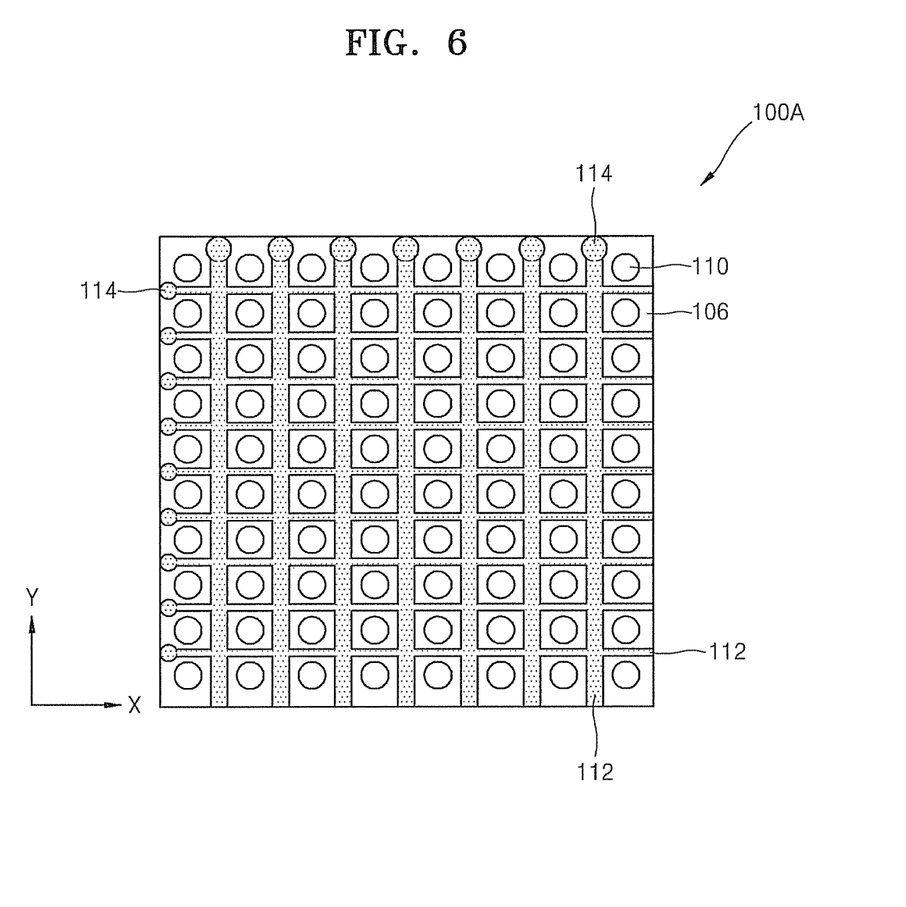
FIG. 6 is a bottom view of a molded underfill flip chip package having the cross-section similar to the cross-section shown in shown in FIG. 2 according to another example embodiment of the invention.

FIG. 4 is a bottom view of a molded underfill flip chip package 100A that may have the cross-section shown in FIG. 2. FIG. 5 is a bottom view of the molded underfill flip chip package 100B shown in FIG. 3. FIG. 6 is a bottom view of a molded underfill flip chip package 100A that may have the cross-section shown in FIG. 2.

Referring to FIGS. 4, 5 and 6, the molded underfill flip chip packages 100A and 100B include the solder balls 110 bonded to points on the backside (bottom surface) of the printed circuit board 106. In example embodiments, the points may or may not be predetermined.

Referring to FIG. 4, the plurality of resin channels 112 may be arranged in parallel on X axis or Y axis, which may be suitable to prevent a warpage defect. For example, FIG. 4 shows plurality of resin channels 112 extending in a Y-direction but being arranged parallel to one another in an X-axis direction. Further, the resin passage holes 114 are respectively arranged at the ends of the resin channels 112 and overlapped on the resin channels 112. Accordingly, when a process of sealing up the surface of the printed circuit board 106 of the underfill flip chip package 100A and the semiconductor chip with the sealant is carried out, resin used as the sealant fills the resin channels 112 through the resin passage holes 114. During this process, air in a mold cavity is removed through the resin channels 112, and thus a void defect generated in the molded underfill flip chip package 100A can be prevented.

Referring to FIG. 5, only one resin channel 112 is formed and the resin passage hole 114 is formed at the end of the resin channel 112 and overlapped thereon. While the resin passage hole 114 is formed at the end of the resin channel 112 in the current example embodiment, the resin passage hole 114 may be formed at the center of the molded underfill flip chip package 100B at which the semiconductor is mounted. An extra resin repository 116 is formed at the end of the resin channel 112, opposite to the resin passage hole 114.

The extra resin repository 116 stores extra sealant left after the sealant fills the mold cavity. A normal molding process fills the mold cavity with a correct quantity of sealant. However, when the quantity of sealant exceeds the volume of the inner space of the mold cavity, the sealant leaks to the outside of the mold cavity to generate resin flash. The extra resin repository 116 collects extra resin to prevent the resin flash.

While the extra resin repository 116 is formed in the printed circuit board 106 in the current example embodiment, the extra resin repository 116 may be formed in the mold used for the molding process. Further, the extra resin repository 116 may be formed at the edge of the printed circuit board 106, which may be removed through a singulation process, if the printed circuit board 106 includes a plurality of semiconductor packages formed thereon in a matrix form. If the extra resin repository 116 is formed in the mold or at the edge of the printed circuit board 106, which is removed through the singulation process, the molded underfill flip chip package 100B may not include the extra resin repository 116.

Referring to FIG. 6, a plurality of resin channels 112 are arranged in a mesh form on X axis and Y axis, which is suitable to prevent simultaneous generation of warpage defect on X axis and Y axis. The resin passage holes 114 are respectively formed at the ends of the resin channels 112 arranged on X axis and Y axis to prevent a void defect generated during the molding process.

Figure 7A:
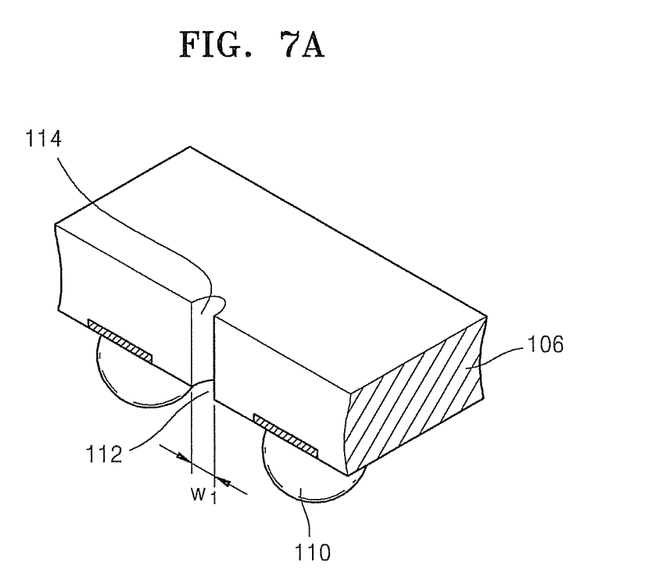
FIG. 7A is a perspective/section view of a molded underfill flip chip package having of a resin channel and resin passage hole.

FIG. 7A is a cross-sectional/perspective view of the molded underfill flip chip package 100A shown in FIG. 2 without showing the sealant 108. As can be seen in FIG. 7A, the resin channel 112 may resemble a groove extending along a bottom surface of the molded underfill flip chip package 100A and the resin passage hole 114 may extend through the printed circuit board 106 to communicate with the resin channel 112. Although a radius r1 of the resin passage hole 114 is shown to be substantially the same as a width W1 of the resin channel 112, example embodiments are not limited thereto. For example the width W1 of the resin channel 112 may be larger or smaller than the radius r1 of the resin passage hole 114.

Figure 7B:
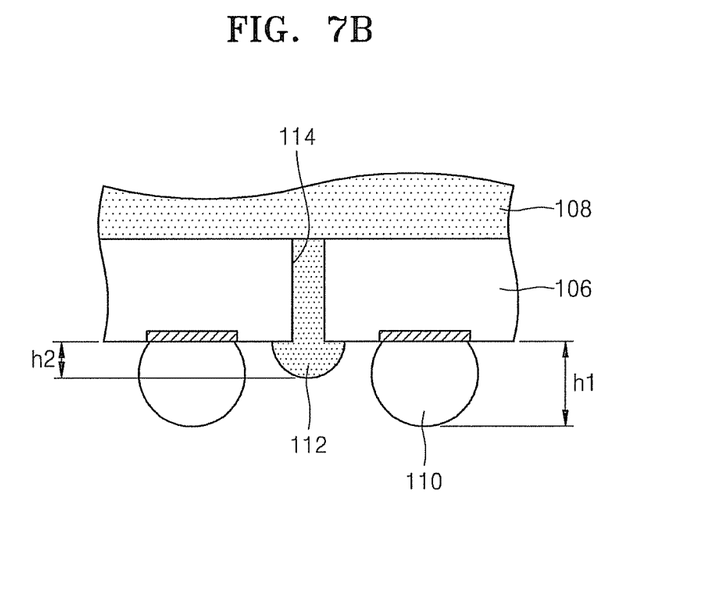
FIG. 7B is a cross-sectional illustrating a height of sealant protruding from a resin channel in the molded underfill flip chip package shown in FIG. 2.

FIG. 7B is a cross-sectional view for explaining a height of the sealant 108 protruding from the resin channel 112 in the molded underfill flip chip package 100A shown in FIG. 2.

Referring to FIG. 7B, it is appropriate for the resin channel 112 of the molded underfill flip chip package 100A to have sealant 108 protruding therefrom to have a height h2 equal to or lower than half the height h1 of the solder ball 110 because the height h1 of the solder ball 110 may be reduced when the solder ball 110 is mounted on an electronic device. While the sealant 108 protruding from the resin channel 112 is illustrated as having a hemispherical shape in FIG. 7B, the invention is not limited thereto. For example, the end of the sealant 108 protruding from the resin channel 112 may have various forms or shapes, e.g. square, rectangular, or oval forms.

The sealant 108 locks the printed circuit board 106 from the surface and the backside of the printed circuit board 106 based on the resin passage hole 114, and thus a warpage defect may be prevented or reduced and absorption reliability may be improved owing to the structure of the sealant 108 having a hygroscopic property (e.g. moisture absorption rate) lower than that of the printed circuit board 106.

In example embodiments, the sealant 108 may form a resin protection layer and resin plug. The resin protection layer may be considered the portion of the sealant 108 above the top surface of the PCB 106. The plug may be described as having a head (a portion of the sealant 108 protruding from the resin channel 112, for example, the hemispherical shape in FIG. 7B) and a neck (a portion of the sealant occupying the resin passage hole 114). Having the plug configuration allows PCB 106 to be locked to the semiconductor chip 102 by the sealant 108 since the head portion interfaces with the bottom surface of the PCB 106 and the plug is integral with the resin protection layer.

Figure 8:
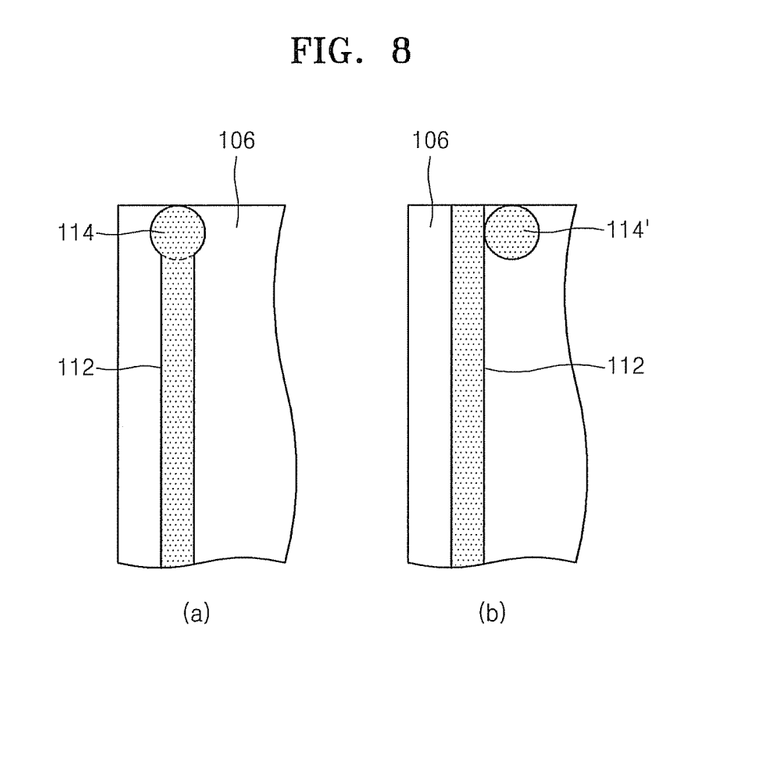
FIG. 8 is a plan view illustrating positions of a resin passage hole and a resin channel in a printed circuit board used for a molded underfill flip chip package according to an example embodiment of the invention.

FIG. 8 is a plan view for explaining positions of the resin passage hole 114 and the resin channel 112 in the printed circuit board 106 used for the molded underfill flip chip package according to an example embodiment of the invention.

While the resin passage hole 114 is overlapped on the resin channel 112 in the printed circuit board 106 in the above-described example embodiments shown in FIGS. 4, 5 and 6, as shown in FIG. 8(a), a resin passage hole 114' may be arranged without being overlapped on the resin channel 112, as shown in FIG. 8(b). In this case, the resin channel 112 may be formed using a mold used for a molding process.

Figure 9:
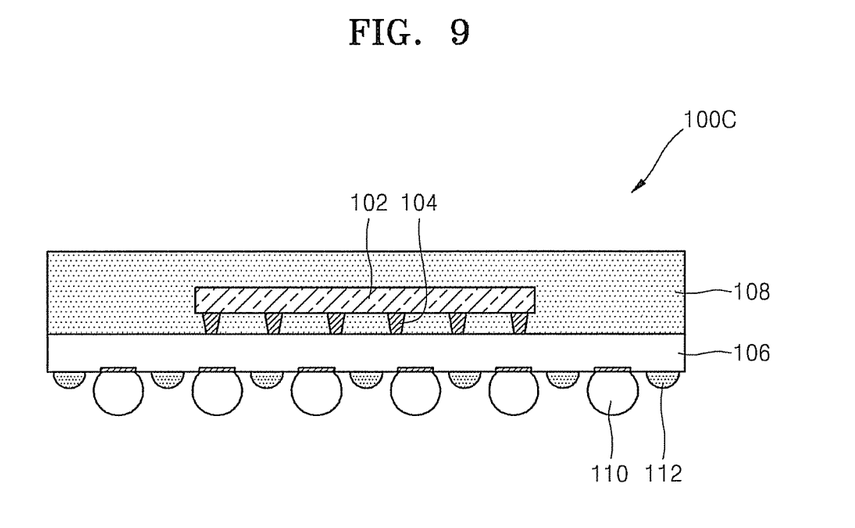
FIG. 9 is a cross-sectional view illustrating a molded underfill flip chip package that may have reduced warpage and voids according to another embodiment of the invention.

FIG. 9 is a cross-sectional view for explaining a molded underfill flip chip package 100C that may prevent warpage and voids according to another example embodiment of the invention.

In the above-described example embodiment illustrated in FIG. 2, the resin passage hole 114 is formed in the printed circuit board 106. However, a conventional molded underfill flip chip package is manufactured in such a manner that a plurality of semiconductor packages are simultaneously fabricated through printed circuit boards in a matrix form. Accordingly, the resin passage hole 114 may be arranged at the edge of the printed circuit board 106 constituting the molded underfill flip chip package 100C. In this case, the edge of the printed circuit board 106 may be removed through a singulation process following a molding process, and thus the final structure of the molded underfill flip chip package 100C does not include the resin passage hole.

Accordingly, the molded underfill flip chip package 100C includes the printed circuit board 106 used to manufacture a semiconductor package, the semiconductor chip 102 mounted on the printed circuit board 106 through the bumps 104, the sealant 108 sealing up the surface of the printed circuit board 106 and the semiconductor chip 102, and the resin channel 112 extending on the backside (bottom surface) of the printed circuit board 106.

In addition, the molded underfill flip chip package 100C according to the current example embodiment may further include the solder balls 110 bonded to the backside of the printed circuit board 106. The resin channel 112 may be formed in the form a single bar, in the form a plurality of parallel bars or in the form of a mesh. Moreover, an extra resin repository may be formed in the printed circuit board 106 or at the edge of the printed circuit board 106, which may be removed through a singulation process, if required.

While example embodiments of the invention have been particularly shown and described with reference to example embodiments thereof, it will be understood that various changes in form and details may be made therein without departing from the spirit and scope of the following claims.

What is claimed is:

1. A molded underfill flip chip package comprising:
    a printed circuit board having at least one resin passage hole passing through the printed circuit board and at least one resin channel defined at a bottom surface of the printed circuit board, the at least one resin channel extending from the at least one resin passage hole;
    a semiconductor chip mounted on a top surface of the printed circuit board; and
    a sealant sealing the top surface of the printed circuit board, the semiconductor chip, the at least one resin passage hole, and at least a portion of the at least one resin channel,
    wherein a width or a diameter of the at least one resin passage hole is wider than a width of the at least one resin channel.

2. The molded underfill flip chip package of claim 1, wherein the at least one resin passage hole is in a region of the printed circuit board other than an exposed printed circuit pattern of the printed circuit board.

3. The molded underfill flip chip package of claim 1, wherein the semiconductor chip is mounted on the printed circuit board through bumps.

4. The molded underfill flip chip package of claim 1, wherein the semiconductor chip is back-ground.

5. The molded underfill flip chip package of claim 1, wherein the printed circuit board is a flexible printed circuit board.

6. The molded underfill flip chip package of claim 1, wherein the printed circuit board is a rigid printed circuit board.

7. The molded underfill flip chip package of claim 1, wherein the at least one resin channel is a single resin channel.

8. The molded underfill flip chip package of claim 1, wherein the at least one resin channel includes a plurality of resin channels arranged in parallel.

9. The molded underfill flip chip package of claim 1, wherein the at least one resin channel includes a plurality of rows and columns arranged in a matrix pattern.

10. The molded underfill flip chip package of claim 1, further comprising:
    a solder ball bonded to the bottom of the printed circuit board.

11. The molded underfill flip chip package of claim 10, wherein the sealant protrudes from the at least one resin channel and has a height equal to or less than half the height of the solder ball.

12. The molded underfill flip chip package of claim 1, wherein the at least one resin passage hole is overlapped on the at least one resin channel in the printed circuit board.

13. The molded underfill flip chip package of claim 1, wherein the at least one resin passage hole is not overlapped on the at least one resin channel in the printed circuit board.

14. The molded underfill flip chip package of claim of claim 1, wherein the printed circuit board includes an extra resin repository formed at an end thereof.

15. The molded underfill flip chip package of claim 1, wherein the at least one resin channel is a plurality of resin channels arranged in parallel rows on the bottom surface of the printed circuit board.

16. The molded underfill flip chip package of claim 1, wherein the printed circuit board includes a resin repository formed at an end thereof.

17. The molded underfill flip chip package of claim 1, wherein the at least one resin channel crosses the at least one resin passage hole at a first area, and longitudinally extends to a second area not including the resin passage hole.

18. A molded underfill flip chip package comprising:
    a printed circuit board having at least one resin passage hole passing through the printed circuit board and at least one resin channel defined at a bottom surface of the printed circuit board, the at least one resin channel extending from the at least one resin passage hole;
    a semiconductor chip mounted on a top surface of the printed circuit board; and
    at least one resin plug locking the printed circuit board to the semiconductor chip, the at least one resin plug passing through the at least one resin passage hole and filling at least a portion of the at least one resin channel,
    wherein a width or a diameter of the at least one resin passage hole is wider than a width of the at least one resin channel.

19. The molded underfill flip chip package of claim 18, further comprising:
    a resin protection layer on the top surface of the printed circuit board, the resin protection layer covering the semiconductor chip, wherein the at least one resin plug is integral with the resin protection layer via the at least one resin passage hole.

20. The molded underfill flip chip package of claim 19, wherein the at least one resin plug includes a neck in the at least one resin passage hole and a head interfacing with the bottom surface of the printed circuit board to lock the semiconductor chip to the printed circuit board.

* * * * *